United States Patent [19]
Kamiya et al.

[11] Patent Number: 6,002,987
[45] Date of Patent: *Dec. 14, 1999

[54] METHODS TO CONTROL THE ENVIRONMENT AND EXPOSURE APPARATUS

[75] Inventors: Saburo Kamiya; Naoyuki Kobayashi, both of Tokyo, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/824,467

[22] Filed: Mar. 26, 1997

[30] Foreign Application Priority Data

Mar. 26, 1996 [JP] Japan ................................. 8-096259
Mar. 28, 1996 [JP] Japan ................................. 8-099278

[51] Int. Cl.⁶ .......................... G01K 11/16; G03B 27/52; G03B 27/42
[52] U.S. Cl. .................. 702/56; 364/528.15; 250/492.2; 355/30; 355/53; 355/55; 355/77
[58] Field of Search ............................. 364/528.15, 507, 364/508; 250/492.1, 492.2; 355/30, 53, 55, 77; 702/189, 190, 191, 56; 73/570, 579, 432.1, DIG. 1

[56] References Cited

U.S. PATENT DOCUMENTS

| | | | |
|---|---|---|---|
| 4,989,031 | 1/1991 | Kamiya | 355/30 |
| 5,155,523 | 10/1992 | Hara et al. | 355/53 |
| 5,430,303 | 7/1995 | Matsumoto et al. | 250/492.2 |
| 5,508,518 | 4/1996 | Kendall | 250/492.2 |
| 5,526,292 | 6/1996 | Hodgson et al. | 364/574 |
| 5,638,304 | 6/1997 | Billoud | 364/572 |

*Primary Examiner*—Hezron Williams
*Assistant Examiner*—Rose M. Miller
*Attorney, Agent, or Firm*—Chapman and Cutler

[57] ABSTRACT

An exposure apparatus includes an exposure system which transfers a pattern of a mask onto a substrate; a chamber in which the exposure system is housed; an air-conditioner which is associated with the chamber and which air-conditions the chamber; and a noise eliminating device which is arranged between the exposure system and the air-conditioner and which eliminates at least a portion of the noise components near a resonant frequency of the exposure system from noise that is generated in the air-conditioner.

23 Claims, 4 Drawing Sheets

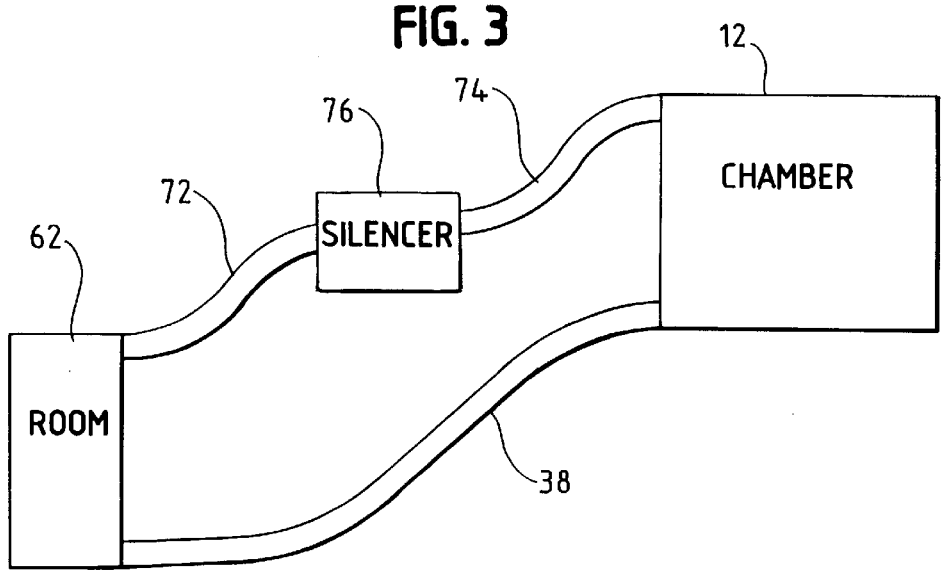
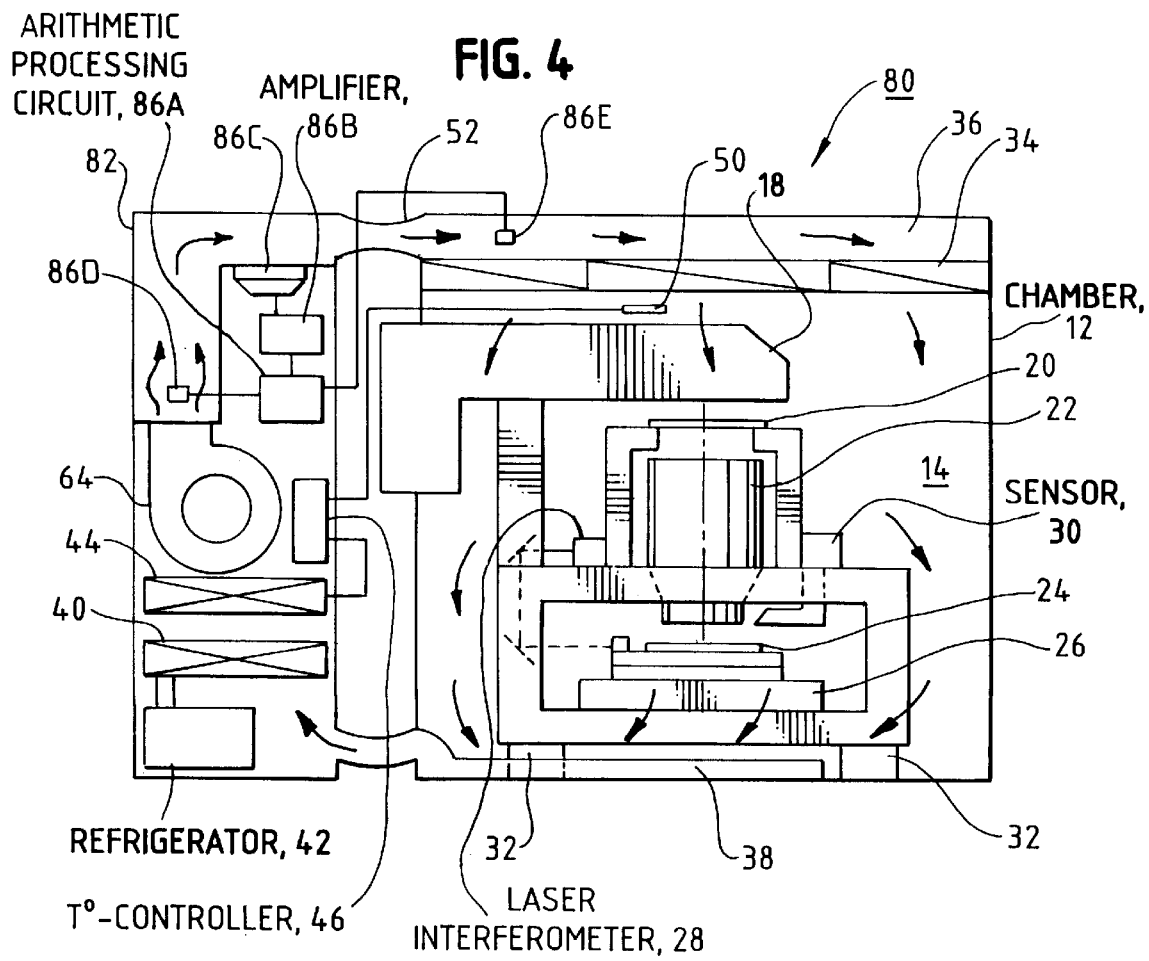

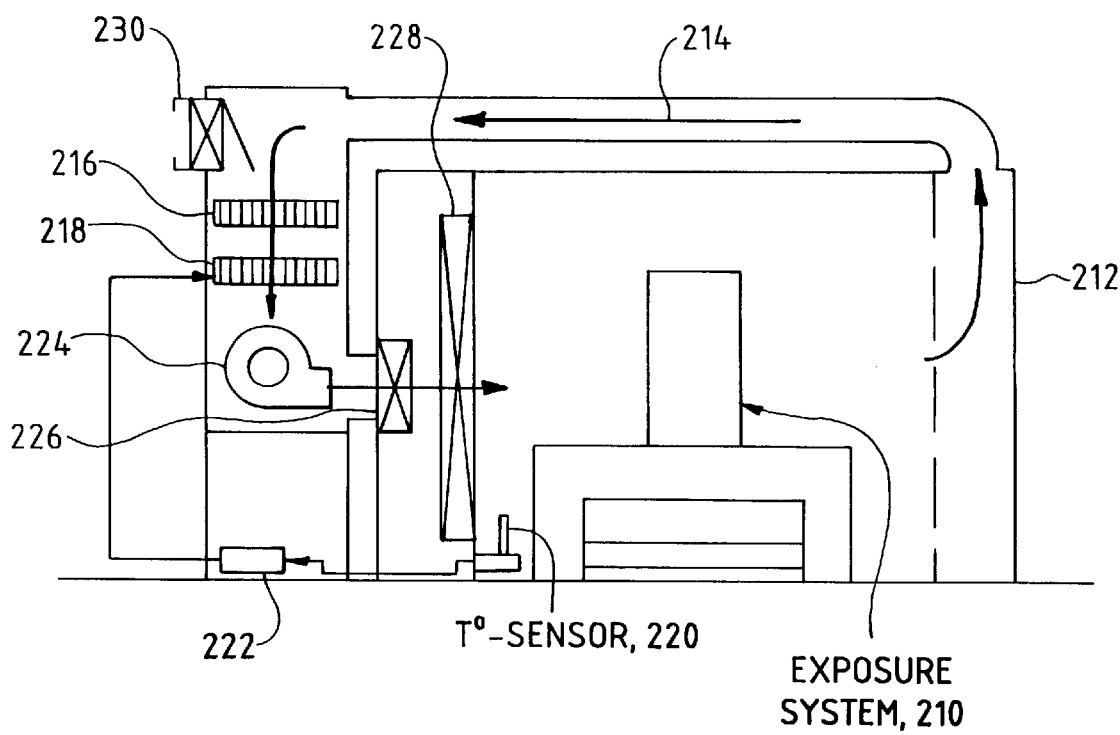

METHODS TO CONTROL THE ENVIRONMENT AND EXPOSURE APPARATUS

FIELD OF THE INVENTION

The present invention concerns an exposure apparatus that is used, for example, during the photolithography process in the manufacture of semiconductor integrated circuits and liquid crystal display substrates. The invention particularly concerns methods for controlling noise in the environment of the exposure apparatus which is housed in a chamber.

BACKGROUND OF THE INVENTION

Generally, a very highly accurate temperature control and high degree of cleanness are required in an exposure apparatus that is used in the manufacture of semiconductor circuits, particularly, for example, highly integrated super LSI (Large Scale Integration) and liquid crystal circuits. Accordingly, the entire exposure system (the main body of the exposure apparatus), which performs exposure, is arranged within a chamber. An air-conditioning room containing, for example, a heat exchanger, is provided for the exposure apparatus, and an air-conditioner supplies temperature-adjusted air into the chamber where the exposure system is installed. A ULPA (Ultra Low Penetration Air) filter, for example, is provided at the supply opening for the temperature-adjusted air, and air from which dust and dirt, for example, are removed, is supplied into the chamber, where the exposure system is installed. To accompany an improvement in the degree of integration of semiconductor circuits, it is necessary to remove extremely microscopic dust and dirt that float within the chamber, and the degree of microscopy in filters for the elimination of dust and dirt has been improved. Also, when using a chemical amplification type photoresist, a filter that removes chemical substances is provided in addition to the dust and dirt filter, in order to control deterioration in the performance of the photoresist.

Then, most of the air that is supplied to the chamber is brought back to the air-conditioning room and used for circulation.

A common projection exposure apparatus will be further explained with reference to FIG. 7. FIG. 7 shows an exposure system (main body of an exposure apparatus) 210 housed within a chamber 212 in which temperature-controlled air 214 circulates. A cooling device 216 which cools air that passes through the exposure system 210 and a heating device 218 which heats the cooled air to the proper temperature, are installed within the chamber 212. A temperature sensor 220 that detects the temperature of the air near the exposure system 210 is arranged alongside the exposure system 210. A temperature controller 222 controls the heating device 218 based on the temperature detected by the temperature sensor 220.

After the air temperature has been controlled by the heating device 218, the temperature-controlled air is sent towards the exposure system 210 by an air blower 224. A chemical substance filter 226 is arranged near the air blowing opening of the air blower 224 so that reactive chemical substances in the air are removed. A dust and dirt filter 228 is arranged in front of the chemical substance filter 226, and dust and dirt in the air are removed. Furthermore, an other chemical substance filter 230 is arranged within the chamber 212 in order to remove reactive chemical substances present in the outside air that is taken into the chamber 212.

A temperature control in each part of the exposure system that is higher in accuracy is required in order to comply with the need for further improvement in the accuracy of the exposure system. For this purpose, multiple blow-off openings are provided within the chamber. When many air blow-off openings are provided within the chamber, an increase in the air flow rate and an increase in pressure loss of the air flow occur and, therefore, it inevitably becomes necessary to increase the capacity of the air-conditioning equipment.

The increase in the air flow rate and the pressure loss within the chamber can be coped with by increasing the capacity of the air-conditioning equipment. On the other hand, vibrations that are generated from the air-conditioning equipment then become a problem.

More precisely, the level of vibrations generated by the air-conditioning equipment, which were previously small, did not cause many problems because the capacity of the air-conditioning equipment was previously small. However, as the capacity of the air-conditioning equipment increases, the vibrations generated also increase to the point where the vibrations reach a level that affects the accuracy of the exposure system. Of all the vibrations that are generated by the air-conditioning equipment, vibrations that are transmitted through the floor and mechanically coupled parts can be relatively easily coped with by providing a passive vibration isolating device such as a rubber pad, for example. However, an effective coping measure has not previously been discovered for reducing vibrations that are transmitted to the exposure system in the form of pressure waves of air, which is the medium for controlling the environment, that is, the so-called acoustic noise. A method in which vibrations are attenuated by forming a baffle within the flow path of air, a nd a method in which propagation is prevented by creating interference by dividing the flow path into two systems of different lengths, for example, can be considered. However, the equipment itself becomes oversized, and a large pressure loss occurs when such methods are used. Also, there is the inconvenience of not being able to sufficiently cover low frequency bands.

Moreover, a sirocco fan that uses forward curved vanes is generally mounted on the air blower of the exposure apparatus. A sirocco fan is used because it suits the pressure loss and the air flow rate that are generated in this type of device, noise audible to human hearing is low, and such an air blower is small in size and cheap in cost.

However, a sirocco fan has the characteristic of having a low noise audible to human hearing but having a loud noise, as physical noise that is actually generated, particularly at frequencies less than several hundred Hz. This noise at frequencies less than several hundred Hz is sound that is near the mechanical resonant frequency in an actual exposure system, for example. As a result, the sound pressure within the chamber fluctuates due to the noise that is generated from the air blower, and the mechanical resonance is excited.

When a sirocco fan is used as the air blower within an air-conditioning room of an exposure apparatus, it is known that the noise generated from the sirocco fan is noise near the mechanical resonant frequency of the exposure apparatus. A mechanical resonance is generated which drastically affects the alignment accuracy between the original plate (mask and reticle) and the substrate (for example, a wafer) that is to be processed within the exposure system, to a degree that cannot be ignored, and a proper exposure cannot be obtained.

Also, the known common exposure apparatus does not include a silencer for the purpose of reducing sounds near the mechanical resonant frequency of the exposure apparatus of less than several hundred Hz that are generated from the air blower.

Furthermore, noise from air blowers has become problematic in various kinds of devices, but noise audible to human hearing is considered problematic in all cases. Few studies have been made from the view point of industrial manufacturing devices that have a characteristic in which the mechanical resonance determines the performance of the device, as in an exposure apparatus for semiconductor integrated circuits, which apparatus is automatically operated with almost no inclusion of operators.

SUMMARY OF THE INVENTION

The purpose of the present invention is to provide a method for controlling the environment which does not substantially affect the exposure operation.

Another purpose of the present invention is to provide a method for controlling the environment that can deal with vibrations or noise generated from the air-conditioning equipment.

Another purpose of the present invention is to provide a method for controlling the environment that can deal with acoustic noise.

Another purpose of the present invention is to provide an exposure apparatus that can expose a pattern image of a mask onto a substrate accurately.

Another purpose of the present invention is to provide an exposure apparatus in which characteristic sounds at frequencies near the mechanical resonant frequency of the exposure system (main body of the exposure apparatus) can be reduced from among the noises from the air-conditioning equipment.

In achieving the aforementioned purposes, the present invention provides an exposure apparatus equipped with an air-conditioning system which performs air-conditioning within a chamber where the exposure system is housed, and it includes a removal device that removes at least a portion of the noise components near the resonant frequency characteristic of the exposure system from all the noise generated within the air-conditioning system.

Thus, at least a portion of the noise components near the resonant frequency characteristic of the exposure system can be eliminated from all the noise generated from the air-conditioning system during air-conditioning of the chamber interior, where the exposure system is housed, by the air-conditioning system, and the resonance of the exposure system resulting from the noise from the air-conditioning system can be reduced.

In achieving the aforementioned purposes, sounds that are generated within the chamber are detected, a sound of opposite phase from the detected sounds is generated, and acoustic noise is actively cancelled in the environment-controlling method of the present invention.

In the present invention, acoustic signals that have opposite phase are generated for the acoustic noise that is generated from the air-conditioning system, for example. As a result, vibrations that are transmitted to the exposure system by acoustic noise can be attenuated. Also, the effect that is extended to the size of the outer diameter of the entire device is small, and the pressure loss is also small, when an active noise-suppression method as in the present invention is used. Furthermore, the frequency band that can be accommodated is large; therefore, its contribution to the improvement in the accuracy of the exposure apparatus is tremendous.

In achieving the aforementioned purposes, the exposure apparatus of the present invention includes: an exposure system which transfers the mask pattern onto the substrate; a chamber which is provided around the exposure system and which houses the exposure system; an air-conditioning system which performs air-conditioning within the chamber; and a silencer, which reduces the noise at the resonant frequency band characteristic of the exposure system from among the noise generated within the air-conditioning system.

The resonance in the exposure system resulting from noise from the air-conditioning system is reduced by the present invention.

Furthermore, when a reactive type silencer is adopted as the silencer, the sound pressure of noise at the resonant frequency band which is most problematic in the exposure accuracy in the exposure system becomes small by establishing a frequency of sound that can be suppressed by the reactive type silencer, referred to below as the "stop band frequency", at the resonant frequency band characteristic of the exposure system, and the resonance in the exposure system can be controlled.

Furthermore, sounds at the resonant frequency band can be filtered from the noise that is generated from the air blower by installing the silencer near the air blower of the air-conditioning system.

Furthermore, when an active type silencer is adopted as the silencer, the resonance of the exposure system can be controlled by establishing the stop band frequency of the active type silencer at the resonant frequency band, which is characteristic to the exposure system.

In attaining the aforementioned purposes, the exposure apparatus of the present invention is also equipped with: an exposure system which transfers the pattern of the mask onto the substrate; a chamber which is provided around the exposure system and which houses the exposure system; and an air-conditioning system which is associated with the chamber and performs air-conditioning within the chamber. The air-conditioning system includes a turbo-fan or radial fan as the air blower.

A turbo-fan or radial centrifugal fan is adopted as the air blower in an air-conditioning system of the present invention. Therefore, the level of noise near the resonant frequency of less than 200 Hz, which becomes most problematic in the exposure accuracy of the exposure system, is reduced, and the generation of resonance in the exposure system can be controlled.

In achieving the aforementioned purposes, the exposure apparatus of the present invention is further equipped with: an exposure system which transfers the mask pattern onto the substrate; a chamber which is provided around the exposure system and houses the exposure system; an air-conditioning system which is associated with the chamber and performs air-conditioning within the chamber; a chamber wall which is disposed between the air-conditioning system and the exposure system; and a sound-absorbing member which is installed between the exposure system and the chamber wall. The sound-absorbing member is located a defined distance away from the chamber wall according to the resonant frequency characteristic of the exposure system.

In the present invention, noise near the resonant frequency, which is most problematic in the exposure accuracy in the exposure system, can be efficiently absorbed by the sound-absorbing member, the sound pressure becomes small, and the resonance of the exposure system can be controlled.

BRIEF DESCRIPTION OF THE DRAWINGS

FIG. 3 is a diagram illustrating a modified example of the exposure apparatus of the second embodiment.

FIG. 4 is a diagram illustrating a schematic structure of an exposure apparatus of a third embodiment.

FIG. 7 is a schematic elevational diagram which illustrates a conventional exposure apparatus.

DESCRIPTION OF THE PREFERRED EMBODIMENTS

Figure 1:
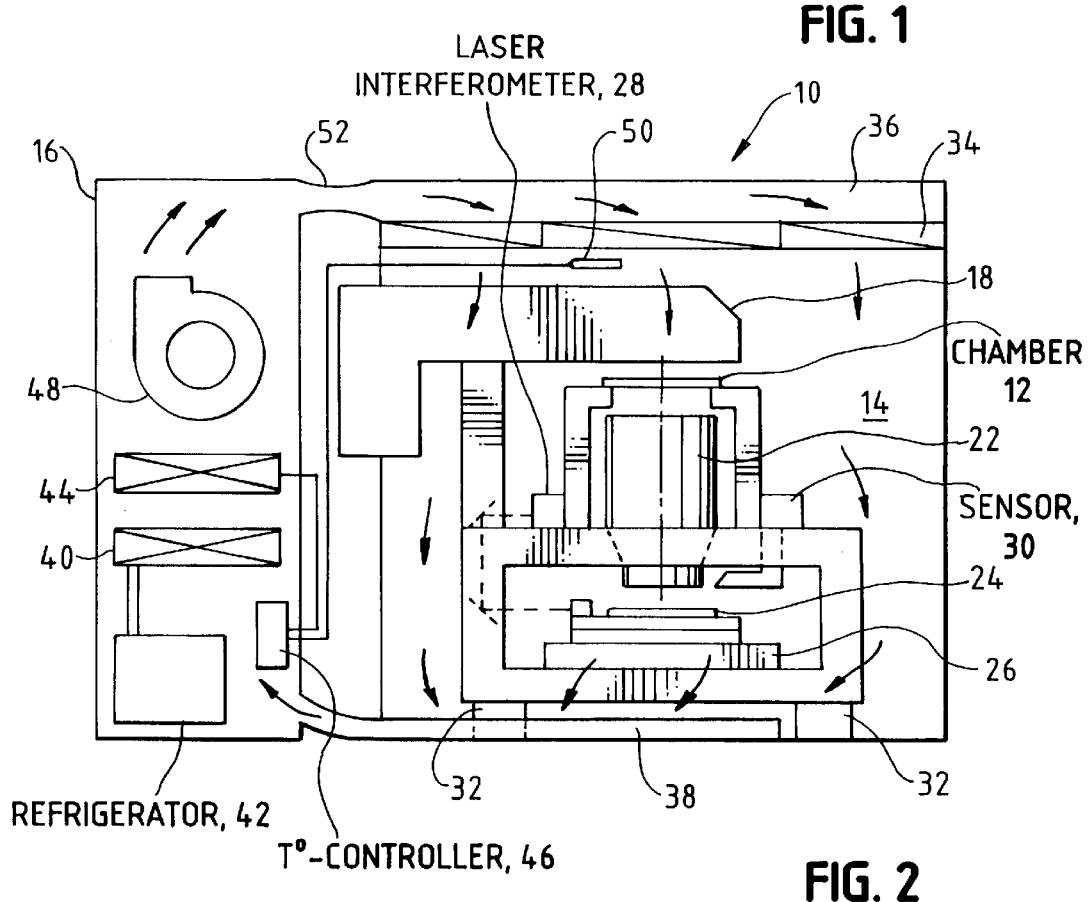
FIG. 1 is a diagram illustrating a schematic structure of an exposure apparatus of a first embodiment.

A first embodiment of the present invention will be described below, with respect to FIG. 1. FIG. 1 illustrates, schematically, a structure of a first embodiment of an exposure apparatus 10. In this exposure apparatus 10, temperature-controlled clean air, from which dust and dirt are removed, is supplied from an air-conditioning machine room 16 to the main body of an exposure unit of the exposure system 14, which is disposed in a chamber 12. Exposure processing is performed under the clean environmental conditions of the exposure system 14 within the chamber 12. The registration accuracy of the circuitry pattern deteriorates as the temperature of the components that make up the exposure system 14 changes. Therefore, it is necessary to control the temperature of each of the components to an accuracy of more than 0.01° C., for example. This temperature control is obtained by supplying air, of which the temperature is controlled highly accurately within the air-conditioning room 16, as will be described in detail below, into the chamber 12, where the exposure system 14 is installed.

The exposure system 14 includes: an illuminating system 18, which radiates the exposure light; a reticle 20 as a mask that has a circuitry pattern formed on one surface; a projection optical system 22, which projects the circuitry pattern of the reticle 20 onto the exposure surface; a stage 26, which supports a wafer 24, onto which the circuitry pattern of the reticle 20 is transferred, and that can move in two-dimensional directions of X and Y axes that are orthogonal; laser interferometer 28, which measures the position of the stage 26 in the X and Y directions; and an alignment sensor 30, which detects the position of the alignment mark that is formed on the wafer in order to position the reticle 20 with the wafer 24, for example.

The exposure system 14 is supported by a vibration isolating table 32, and the effect of vibrations that are transmitted through the floor is eliminated. The entire exposure system 14 is installed within chamber 12. Also, a ULPA filter 34, which removes dust and dirt in the air, is provided at the air-supply opening into the chamber 12 where the exposure system 14 is installed. A plenum 36 also is installed immediately before the ULPA filter 34 in order to homogenize the density of the air which is blown out from the ULPA filter 34. In FIG. 1, only the measuring beam of the laser interferometer 28 in the X-direction is indicated, and the interferometer in the Y-direction and its measuring beam are omitted.

A return duct 38, which collects air that has been supplied to the chamber 12, is provided in a lower area, within the chamber 12 where the exposure system 14 is installed. The air-conditioning room 16 contains: a cooling heat exchanger 40, which cools the air collected by the return duct 38, to a specific temperature; a refrigerating machine 42 which supplies cooling medium to the cooling heat exchanger 40; a heater 44 which heats the air cooled by the cooling heat exchanger 40 to a target temperature; a temperature controller 46 which provides feed-back and controls the heating value of the heater 44 based on the output of a temperature sensor 50 (described below) and the pre-set target temperature level; and an air blower 48 which force feeds the air, that has been adjusted to the target temperature by the heater 44, towards the chamber 12, for example. These elements make up the air-conditioning system for supplying air in which the temperature is adjusted. After having the temperature adjusted by the air-conditioning system, air is supplied into the chamber 12 where the exposure system 14 is installed, through the duct 52, plenum 36, and the ULPA filter 34.

The temperature sensor 50 is provided immediately below the ULPA filter 34 within the chamber 12, and measures the temperature of the air supplied into the chamber 12 where the exposure system 14 is installed. The temperature information output from the temperature sensor 50 is supplied to the temperature controller 46 within the air-conditioning room 16.

An important characteristic of the exposure apparatus 10, in the first embodiment, is that the air blower 48 installed within the air-conditioning room 16 is or includes a centrifugal fan, such as a turbo-fan or a radial fan.

A noise level of less than approximately 200 Hz can be reduced by using a turbo-fan or radial fan when compared to a sirocco fan, which was formerly used. As a result, the generation of sounds near the mechanical resonant frequency of the exposure system 14, that are generated from the air blower 48, can be controlled.

More precisely, a centrifugal fan, which is a turbo-fan or a radial fan, is used as the air blower 48 in the exposure apparatus 10, according to the first embodiment, in order to eliminate noise generated by the air-conditioning system.

When a centrifugal fan is used, it can be considered that the noise audible to human hearing tends to deteriorate by an increase of high-frequency sounds, although this is not inconvenient at all because the exposure apparatus is installed in a semiconductor plant that is operated with almost no operators, and the centrifugal fan itself is also installed within a chamber.

The function of the exposure apparatus 10 which is constructed in the manner described above will be explained based on FIG. 1.

First, operation during exposure by the exposure system 14 which is installed within the chamber 12, will be described.

When preparation, such as the base-line measurement, for example, is completed, the stage 26 is moved by a control system (not shown in FIG. 1) while monitoring the output from the laser interferometer 28. The position of the alignment mark, which is formed on the wafer 24 during a preliminary process before exposure, is detected by the alignment sensor 30. Next, a shot region on the wafer 24 is positioned at the exposure position within the exposure field of the projection optical system by using the position of the alignment mark and the result of the base-line measurement, and the reticle 20 is brought into position alignment with the wafer 24. When the reticle 20, which is the original plate, is illuminated by the illuminating light from the illuminating system 18 after this alignment, the pattern of the reticle 20 is projected on the wafer 24 coated with a resist, through the projection optical system 22, and the wafer 24 is exposed with the pattern image of the reticle 20. Each shot region on the wafer 24 is consecutively positioned with the exposure position within the exposure field of the projection optical system in the exposure system 14, and the pattern of the reticle 20 is consecutively transferred onto each shot region on the wafer 24.

Next, the function of the air-conditioning system of the air-conditioning room 16, which supplies temperature-adjusted air to the chamber 12 where the exposure system 14 is installed, will be described.

Air is drawn into the air-conditioning room 16 from within the chamber 12 through the return duct 38, and air from the outside of the chamber is also taken in through an intake opening (not shown). The air which is taken in through the return duct 38, as well as the air from the outside, which is taken in through the intake opening (not shown) is cooled to a specific temperature by the cooling heat exchanger 40 and heated to the target temperature by the heater 44.

The cooling heat exchanger 40 exchanges heat by means of a cooling medium which is supplied from the refrigerating machine 42. Also, the heater 44 heats the air cooled by the cooling heat exchanger 40 to the target temperature. The heater 44 is feed-back controlled by the temperature controller 46 based on the temperature detected by the temperature sensor 50, which is installed immediately below the ULPA filter 34 within chamber 12.

Temperature adjusted air, which is heated to the target temperature by the heater 44, is blown by the air blower 48 into the plenum 36, before entering the chamber 12. Dust and dirt are then removed by the ULPA filter 34 and air is supplied to the chamber 12 where the exposure system 14 is installed. Most of the air supplied to the chamber 12 is collected by the return duct 38 and is again brought back to the air-conditioning room 16 and recirculated.

In this manner, the temperature within chamber 12, where the exposure system 14 is installed, is maintained constant.

It is known that vibrations generated in the exposure system 14 decrease the registration accuracy of the circuitry pattern and result in deterioration of the projected image. The amplitude of vibrations near the characteristic frequency of the overall structure of the exposure system 14, increases through a resonance phenomenon, and drastically affects the decrease in the registration accuracy.

Therefore, it becomes necessary: (1) to increase the characteristic frequency of the system, and (2) to reduce the disturbance in order to decrease vibrations in the exposure system 14.

With respect to the aforementioned (1), the rigidity of the entire system is designed to be as high as possible when designing the exposure apparatus 10 in the first embodiment of the invention, in order to increase the characteristic frequency of the system. This is because the amplitude of the vibrations increases as the frequency decreases, and the effect of deterioration of accuracy increases even though the vibration energy is the same. Also, with respect to (2) above, an attempt to reduce the effect is made by installing a vibration isolating table 38 as a measure for preventing vibrations occurring through the floor into the exposure system 14 of the exposure apparatus 10 of the first embodiment.

Also, ventilation from inside the air-conditioning room 16 into the chamber 12 is accompanied by loud noise, and it is known that most of that noise is generated from the air blower 48. It has been determined from an investigation by the present inventors that the noise generated from the air blower 48 passes through the duct 52, is then propagated into the chamber 12 by way of the plenum 36 and the ULPA filter 34 and causes vibration of the exposure system 14. Accordingly, it is necessary to minimize, as far as possible, the sound level within the chamber 12, particularly the sound level near the mechanical resonant frequency characteristic of the exposure system 14, in order to reduce the vibrations in the exposure system 14.

Accordingly, a turbo-fan or radial fan is selected as the air blower 48, which is installed within the air-conditioning room 16, as a device to control the noise level at low frequencies of less than 200 Hz near the mechanical resonant frequency of the exposure system 14 in the exposure apparatus 10, in the first embodiment.

As can be clearly observed in the explanation above, a turbo-fan or a radial fan is used as the air blower 48 in the exposure apparatus 10 in the first embodiment in order to reduce noise from the air-conditioning system. Thus, the generation of resonance in the exposure system 14 is reduced below that of a system that uses a known sirocco fan. As a result, the registration accuracy when the circuitry pattern is overlapped onto the wafer 24 for exposure improves, thus making it possible to match exposures of circuitry layer patterns that are more highly integrated and that are microscopic.

The second embodiment of the present invention will be explained with respect to FIGS. 2 and 3. The same reference numerals are used for the same components as in the first embodiment described above, and their description will be omitted or simplified.

Figure 2:
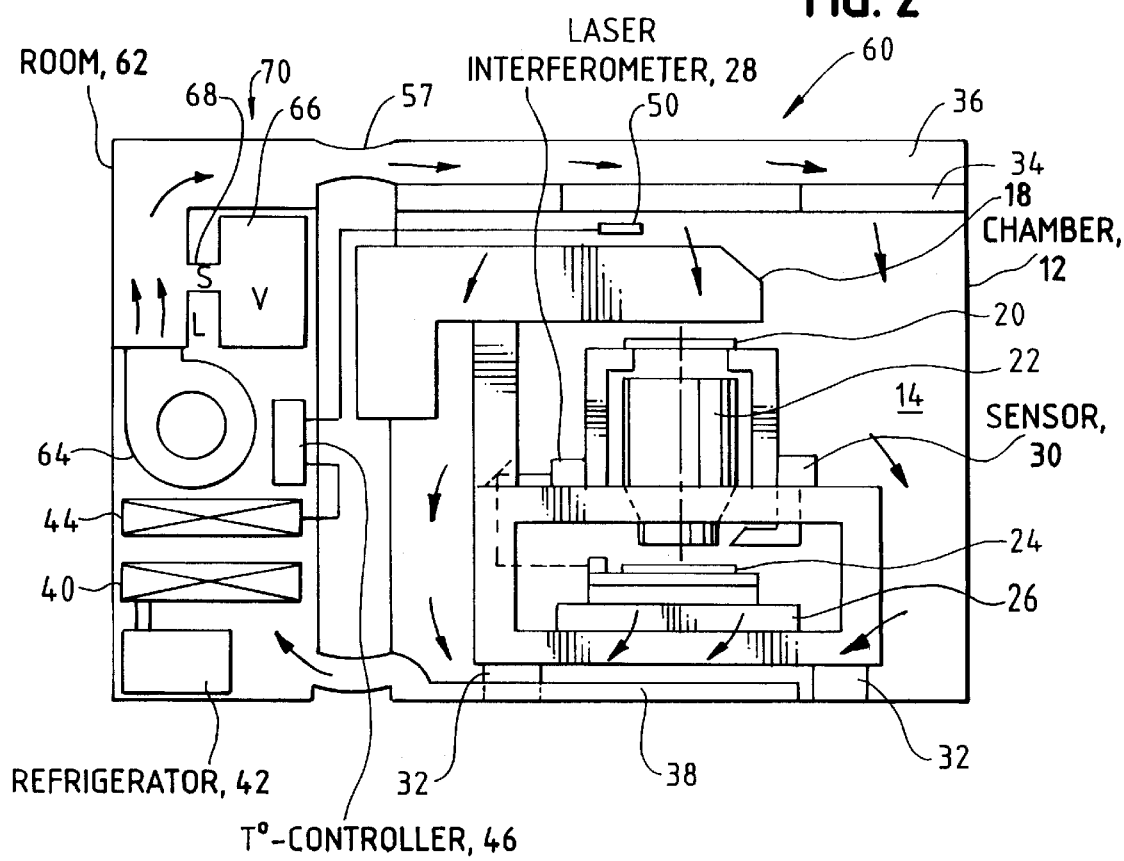
FIG. 2 is a diagram illustrating a schematic structure of an exposure apparatus of a second embodiment.

FIG. 2 illustrates, schematically, the structure of an exposure apparatus 60 of a second embodiment of the invention. Using this exposure apparatus 60, as in first embodiment, clean air, after temperature adjustment in an air-conditioning room 62, and with dust and dirt subsequently removed, is supplied into the chamber 12, where the exposure system 14 is installed. The exposure system 14 performs the exposure process in a clean environment. A resonance-type silencer 70, which is a type of reactive silencer which eliminates sounds at specific frequency bands from noise that is generated by the air blower 64, is installed in the air-conditioning room 62.

The characteristic of the second embodiment is the installation of the resonance-type silencer 70 between the air blower 64 in the air-conditioning room 62 and the intake opening of the chamber 12, as illustrated in FIG. 2. This resonance-type silencer 70 has a hollow section 66 having a volume V, and a connecting pipe 68, which connects the hollow section 66 to a duct 52, with an opening area S and length L.

The resonant frequency $f_p$ of this resonance-type silencer 70 can then be expressed by equation (1) below, in which the speed of the sound is C.

$$f_p = \frac{C}{2\pi}\sqrt{\frac{S}{V \cdot L}} \qquad (1)$$

The attenuation TL of the resonant frequency of the resonance-type silencer 70 can similarly be expressed by the equation (2) below when the cross-sectional area of the duct for the air blower is Sd and the frequency that should be attenuated is f.

$$TL = 10 \log \left| 1 + \left( \frac{\sqrt{V \cdot S / L} / (2Sd)}{f/f_p - f_p/f} \right)^2 \right| \quad (2)$$

Then, the aforementioned V, S, and L are established so that the resonant frequency $f_p$ of equation (1) matches the mechanical resonant frequency characteristic of the exposure system 14.

The attenuation TL of equation (2) becomes infinite ∞ when $f_p=f$, and it will be understood that the sound pressure is reduced the most when approximately $f_p \approx f$.

As can be clearly observed in the explanation above, the resonant frequency generating device is constructed from hollow section 66 and the connecting pipe 68 in the exposure apparatus 60 in the second embodiment, and the noise elimination device is constructed from the resonance-type silencer 70, which includes a resonant frequency generating device. Sounds near the frequency characteristic of the exposure system 14 (the frequency f which must be attenuated), can be eliminated from the noise from the air blower 64 by this resonance-type silencer 70, and the resonance in the exposure system 14 due to the air blower 64 can be controlled. As a result, an exposure is obtained in the exposure system 14 in a condition in which vibrations are controlled, and the registration accuracy when the circuitry pattern is overlapped onto the wafer 24 for exposure improves, thus making it possible to correspond to exposures of the circuitry layer patterns that are more highly integrated and microscopic.

When selecting the characteristic frequency (i.e. frequency f that must be attenuated), a low band frequency also with a large transmission of vibrations to the exposure system 14 by the sound pressure may be selected.

Also, when it is necessary to eliminate sounds of multiple resonant frequencies in the exposure system 14, a number of resonance-type silencers matching each resonant frequency may be installed. In this case, it is possible that the number of resonance-type silencers may not be housed, due to lack of space inside the air-conditioning room 62.

Therefore, a modified example of the second embodiment is illustrated in FIG. 3. The structure shown in FIG. 3, in which the air-conditioning room 62 is situated far away from the chamber 12, may be used. A noise suppressing unit 76, in which a number of resonance type silencers 70 are housed, is connected by distribution ducts 72 and 74 to the air-conditioning room 62 and the chamber 12, respectively, and the chamber 12 and the air-conditioning room 62 are connected by a return duct 38.

Furthermore, a resonance-type silencer 70 was used in the description above as an example of a reactive-type silencer useful in the second embodiment of the invention, described above. However, the present invention is not limited only to this example, and an insertion-type silencer can alternatively be used, in which a muffler, as used in an internal combustion engine, for example, is inserted between the air-conditioning room 62 and the chamber 12 for suppressing noise.

Also, an existing sirocco fan may be used as the air blower 64 in second embodiment described above. However, a turbo-fan and a radial fan are preferably used, as in the first embodiment described above, and a further reduction of the resonant frequency may thus be achieved.

A third embodiment of the invention will next be described, with reference to FIG. 4. In this example, the same reference numerals are used for the same components as in the devices in the first and second embodiments described above, and explanations thereof will be omitted or simplified.

FIG. 4 illustrates, schematically, the structure of a third embodiment of an exposure apparatus 80. With exposure apparatus 80, as in the first and second embodiments, clean air, after temperature adjustment in an air-conditioning room 82, and with dust and dirt subsequently removed, is supplied into chamber 12 where the exposure system 14 is installed. The exposure system 14 performs the exposure process in a clean environment within the chamber 12. An active-type silencer 86, which eliminates noise by generating sound waves that cancel the noise generated from the air blower 64, is installed in the air-conditioning room 82.

The main characteristic of the third embodiment is the installation of an active-type silencer 86 between the air blower 64 within the air-conditioning room 82 and the intake opening of the chamber 12, as illustrated in FIG. 4. This active-type silencer 86 includes: a detection microphone 86D, which detects sounds that are propagated from the air blower 64; an arithmetic processing circuit 86A, which arithmetically processes sound signals detected by the detection microphone 86D and generates sound signals of opposite phase; an amplifier 86B, which amplifies the sound signals of opposite phase that were arithmetically processed by the arithmetic processing circuit 86A; a speaker 86C as a secondary sound source, which outputs sound waves based on the sound signals of opposite phase, which were amplified by the amplifier 86B; and a monitor microphone 86E, which detects the sound waves after the cancellation by the sound waves of opposite phase, which are output from the speaker 86C.

Thus, the active type silencer 86 first detects the noise propagated from the air blower 64 with the detection microphone 86D, and generates sound signals of opposite phase by arithmetically processing the detected sound signals in the arithmetic processing circuit 86A. The sound signals of opposite phase, which are generated in the arithmetic processing circuit 86A are further amplified by the amplifier 86B and output from the speaker 86C. Sound waves that are output from the speaker 86C are the sound waves of opposite phase intended to cancel the noise propagated from the air blower 64. Also, the noise after the cancellation by the sound waves that were output from the speaker 86C is monitored by the monitor microphone 86E. Furthermore, a feed-back control is obtained in the arithmetic processing circuit 86A when sounds near the mechanical resonant frequency characteristic of the exposure system 14 remain in the noise that was monitored by the monitor microphone 86E propagated from the air blower 64 into the chamber 12 in order to generate control signals for generating the necessary sound waves of opposite phase to cancel the noise.

As can be clearly observed from the explanation above, the active-type silencer 86 includes the noise-eliminating device in the exposure apparatus 80 according to the third embodiment, and thus, sounds near the frequency characteristic of the exposure system 14 (i.e. frequency f to be attenuated), can be efficiently eliminated from the noise generated from the air blower 64, and the resonance in the exposure system 14 due to the air blower 64 can be controlled. As a result, the exposure is obtained in the exposure system 14 in a condition in which vibrations are controlled, the registration accuracy when the circuitry pattern is overlapped onto the wafer 24 for exposure improves, thus making it possible to correspond to exposures of circuitry layer patterns that are more highly integrated and microscopic.

This active-type silencer 86 can particularly eliminate random sounds in a wide range of bands, and it becomes possible to efficiently eliminate noise through a more simplified arithmetic process when only sounds near the resonant frequency of the exposure system 14 are to be eliminated.

The exposure apparatus 80 in the third embodiment includes a monitor microphone 86E to perform a feed-back control to generate control signals in order to form the necessary sound waves of opposite phase for the cancellation of sounds near the mechanical resonant frequency characteristic of the exposure system 14, but the installation of this monitor microphone 86E is not always necessary. Even if it is not installed, the detection microphone 86D, which makes up the active-type silencer 86 as a noise eliminating device, detects frequency components generated near the air blower within the air-conditioning room, the arithmetic processing circuit 86A forms sound signals of opposite phase that cancel sounds near the mechanical resonant frequency characteristic of the exposure system 14, from the frequency components detected by the detection microphone 86D, the sound-eliminating speaker 86C outputs sound waves of opposite phase that cancel the sounds near the mechanical resonant frequency based on the sound signals that were formed in the arithmetic processing circuit 86D. As a result, noise near the mechanical resonant frequency from the air blower 64 is canceled by the sound of the stop band frequency, which is generated by the active-type silencer 86, the sound pressure near the mechanical resonant frequency of the exposure system 14 is reduced, and the resonance of the exposure system 14 can be controlled.

As in the second embodiment, illustrated in FIG. 3, the third embodiment can also embody a structure in which the noise suppressing unit 76, 86 in the third embodiment is separated from the air-conditioning room 62, 82 in the third embodiment.

The fourth embodiment of the present invention will be described with respect to FIG. 5 below. In this example, the same reference numerals are used for the same components as in the devices of the first, second or third embodiments described above, and explanations thereof will be omitted or simplified. Also, the area of the air-conditioning room can be, for example that of an air-conditioning room in the existing exposure apparatus, or the same structures as are described for the first, second or third embodiments, and their illustration is omitted.

Figure 5:
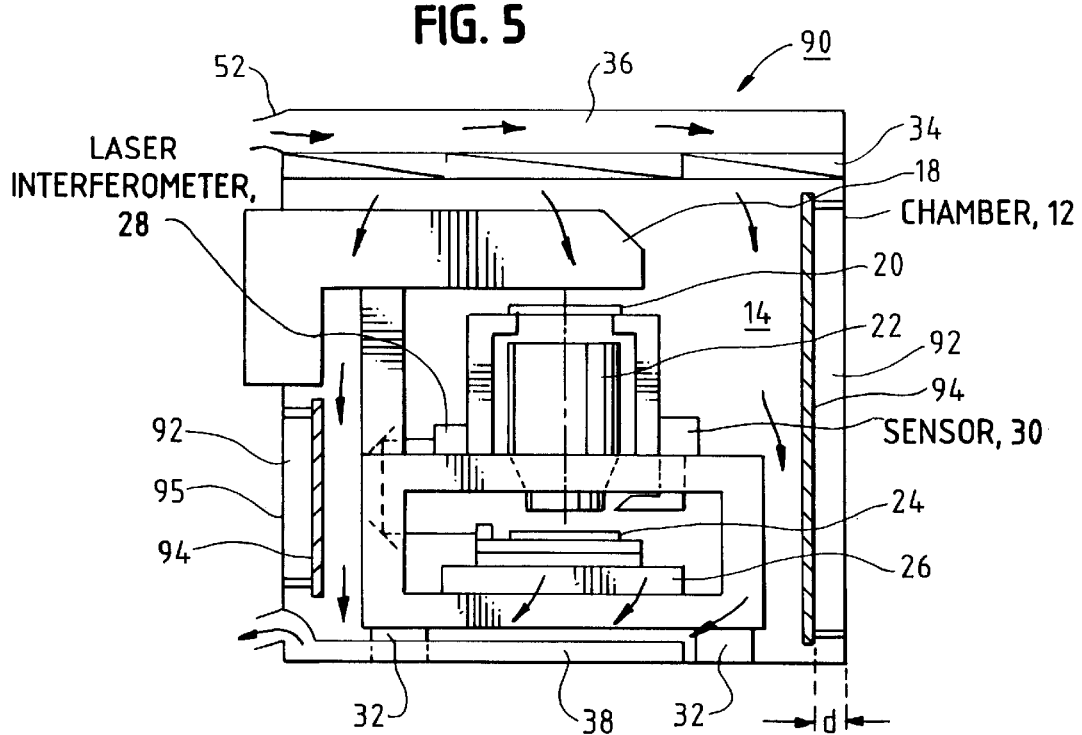
FIG. 5 is a diagram illustrating a schematic structure of an exposure apparatus of a fourth embodiment.

FIG. 5 illustrates, schematically, the structure of an exposure apparatus 90, useful in the fourth embodiment of the invention. Using exposure apparatus 90, as in the first second and third embodiments, the exposure process is performed while supplying clean air, in which the temperature is adjusted in an air-conditioning room (not shown in FIG. 5) and from which dust and dirt are removed, into the chamber 12 where the exposure system 14 is installed. A noise-absorbing member 96, which absorbs noise generated from the air blower (not shown in FIG. 5), is installed within chamber 12.

The main characteristic of the fourth embodiment is the installation of a noise-absorbing plate 94 as the noise-absorbing member on the inner wall of the chamber 12, as shown in FIG. 5. This noise-absorbing plate 94 is arranged spaced apart from the wall surface 95 of the chamber 12 with an air layer 92 of thickness d therebetween. In this example, a sound absorbing porous material that is made of glass wool, for example, is used.

The generation of low-frequency sounds of less than 200 Hz near the mechanical resonant frequency of the exposure system 14, for example, becomes problematic particularly in the exposure apparatus 90 in the fourth embodiment. Accordingly, low-frequency sounds of less than 200 Hz are effectively absorbed by establishing the thickness d of the air layer 92 between the wall surface of the chamber 12 and the noise-absorbing plate 94 at approximately 300 mm, for example, in the exposure apparatus 90.

In this way, the noise-absorbing plate 94, which is arranged spaced from the inner wall of the chamber 12 with the air layer 92 therebetween, comprises the noise-eliminating device in the exposure apparatus 90 in the fourth embodiment, and through this sound-absorbing member 94, sounds near the mechanical resonant frequency characteristic of the exposure system 14 can be efficiently absorbed within the chamber 12 from the noise that is generated from the air blower (not shown in FIG. 5), and the resonance in the exposure system 14 due to the noise from the air blower in the air-conditioning room can be controlled. As a result, exposure becomes possible at the exposure system 14 in a condition in which vibrations are controlled, the registration accuracy when the circuitry pattern is overlapped onto the wafer 24 for exposure improves, thus making it possible to match exposures of circuitry layer patterns that are more highly integrated and microscopic.

The thickness d of the air layer 92 of the noise absorbing member 96 was established at approximately 300 mm so that low-frequency sounds of less than 200 Hz can be absorbed in the structure, according to the fourth embodiment, however, without being limited only to this, it is possible to absorb noise of the intended frequency by appropriately changing the thickness d accordingly when the mechanical resonant frequency characteristic of the exposure system 14, is different.

Also, the noise-absorbing members 96 are respectively installed according to the shape of the wall surfaces at both the left and right sides of the chamber 12 in the structure shown in FIG. 5. It is also possible to install noise-absorbing members 96 on wall surfaces of the chamber 12 towards the front side or the back side of the main body of the exposure unit 14.

The fifth embodiment of the present invention will be explained by reference to FIG. 6.

Figure 6:
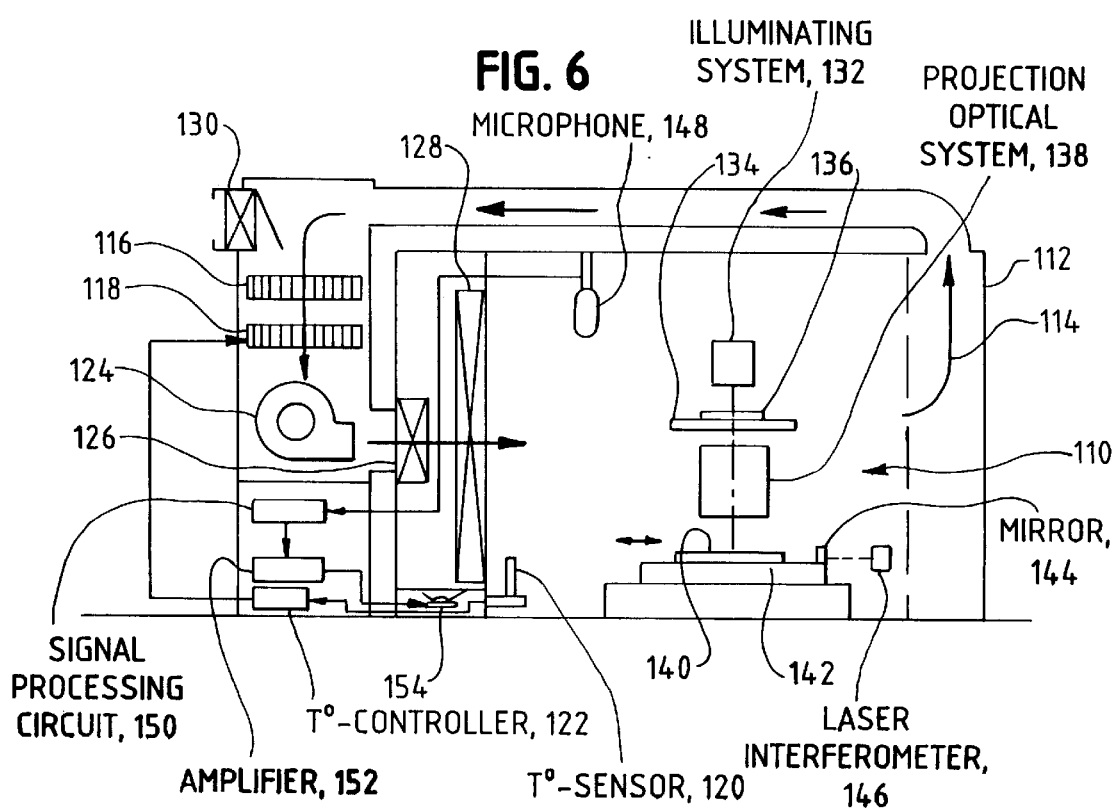
FIG. 6 is a schematic elevational diagram illustrating an exposure apparatus of a fifth embodiment.

FIG. 6 illustrates a projection exposure apparatus of the fifth embodiment. In FIG. 6, an exposure system of the main body of the projection exposure apparatus 110 is housed within a chamber 112 through which temperature-controlled air 114 circulates. A cooling device 116, which cools air, and a reheater 118, which heats this cooled air to the proper target temperature are provided within the chamber 112. A temperature sensor 120, which detects the temperature of the air near the exposure system 110, is arranged at a side part of the exposure system 110. A temperature controller 122 controls the reheater 118 based on the temperature detected by temperature sensor 120.

Air, after having its temperature adjusted by the reheater 118, is blown towards the exposure system 110 by an air blower 124. A chemical substance filter 126 is arranged near the air blowing opening of the air blower 124 so that reactive chemical substances in the air can be removed. A dust and dirt filter 128 is arranged in front of the chemical substance filter 126 in order to remove dust and dirt in the air. Another chemical substance filter 130 is also arranged in front of the cooling device 116 within the chamber 112 so that reactive chemical substances in the air from the outside that is taken into the chamber 112 are also removed.

In the exposure system 110, exposure light is irradiated onto a reticle 136, which is mounted on a reticle stage 134, by an illuminating system 132. The image of a pattern that is formed on the reticle 136 is projected onto a wafer 140 by a projection optical system 138. The wafer 140 is mounted on the wafer stage 142. A moving mirror 144 is provided at the end part of the wafer stage 142. The moving mirror 144 reflects laser light that is emitted from a laser interferometer 146, and the laser interferometer 146 measures the position of the wafer stage 142 based on that reflected light.

A microphone 148 which detects acoustic noise within the chamber 112 is installed in the upper part of the chamber 112. The microphone 148 converts detected sound signals into electrical signals and supplies the electrical signals to a signal-processing circuit 150. The signal-processing circuit 150 forms electrical signals that correspond to acoustic signals with phases which cancel the acoustic noise that was detected (opposite phase) based on the electrical signals that were supplied from the microphone 148, and supplies them to an amplifier 152. The amplifier 152 amplifies the signals from the signal processing circuit 150 to a certain level and supplies them to the speaker 154. The amplification factor of signals by the amplifier 152 requires a sufficient value for the operation of the speaker 154. The speaker 154 converts the electrical signals that are supplied from the amplifier 152 into acoustic signals, and generates the acoustic signals into the chamber 112 towards the air which has passed through the chemical substance filter 126 and is supplied to the dust and dirt filter 128.

As explained above, acoustic signals of opposite phase to the acoustic noise that was detected by the microphone 148 are supplied into the environment chamber 112 from the speaker 154 in this fifth embodiment, therefore, the acoustic noise is canceled, and vibrations of the exposure system caused by acoustic noise can be controlled. The microphone 148 and the speaker 154 are arranged in positions which allow for the most satisfactory detection of acoustic noise and its elimination by the positional relationship with the air-conditioning system, such as the air blower 124, for example.

Also, multiple microphones and speakers may be used if necessary. For example, microphones and speakers may be provided near the optical path of the interferometer, which is easily affected by environmental factors, such as vibrations and temperature, so that the environment near the optical path affected by acoustic noise may be controlled by an independent control.

Furthermore, vibrations of the moving mirror 144 also drastically affect the measuring of the position of the wafer stage 142; therefore, the acoustic vibration environment near the moving mirror 144 may be independently controlled.

The entire disclosure of Japanese Patent Application No. 8-096259, filed Mar. 26, 1996, and Japanese Patent Application No. 8-099278, filed Mar. 28, 1996, including the specification, claims, drawings and abstract are incorporated herein by reference, in their entirety.

What is claimed is:

1. A method of controlling the environment of an exposure system for use in making semiconductor circuits using photolithography comprising the steps of:
   detecting a noise in a chamber in which an exposure system for transferring a pattern of a mask onto a substrate is housed; and
   controlling an operational environment of said exposure system by generating sounds of opposite phase to the detected noise, whereby vibration of said exposure system is substantially prevented.

2. An exposure apparatus comprising:
   an exposure system which transfers a pattern of a mask onto a substrate;
   a chamber which is provided around said exposure system and houses said exposure system;
   an air-conditioner which is associated with said chamber and performs air-conditioning of said chamber; and
   a reactive silencer, which is arranged between said exposure system and said air-conditioner, and reduces noise at a resonant frequency of said exposure system, said noise being part of noise that is generated in said air-conditioner.

3. An exposure apparatus according to claim 2, wherein said air-conditioner includes an air-blower and said reactive silencer is provided near said air blower.

4. An exposure apparatus according to claim 2, wherein said reactive silencer comprises a generator generating sounds which resonate with sounds at a resonant frequency band that is characteristic of said exposure system.

5. An exposure apparatus according to claim 2, further comprising a microphone that is provided between said silencer and said exposure system, and which detects sounds being transmitted to said exposure system.

6. An exposure apparatus, comprising:
   an exposure system which transfers a pattern of a mask onto a substrate;
   a chamber which is provided around said exposure system and houses said exposure system;
   an air-conditioner which is associated with said chamber and performs air-conditioning of said chamber; and
   an active silencer, which is arranged between said exposure system and said air-conditioner, and reduces noise at a resonant frequency of said exposure system, said noise being part of noise that is generated in said air-conditioner.

7. An exposure apparatus according to claim 6, wherein said active silencer includes a signal-generating device which generates sound signals of opposite phase that cancel sound near a specific resonant frequency of said exposure system and a speaker which outputs sound formed on the basis of said sound signals.

8. An exposure apparatus comprising:
   an exposure system which transfers a pattern of a mask onto a substrate;
   a chamber which is provided around said exposure system and houses said exposure system, said chamber having a wall member between said chamber and said exposure system; and
   a noise-absorbing member which is provided between said exposure system and the wall member of said chamber, said noise-absorbing member being arranged at a predetermined distance from the wall member of said chamber, according to a characteristic resonant frequency of said exposure system.

9. An exposure apparatus comprising
   an exposure system which transfers a pattern of a mask onto a substrate;
   a chamber which is provided around said exposure system and which houses said exposure system;
   an air-conditioner which is associated with said chamber and which performs air-conditioning of said chamber; and
   a plurality of silencers housed in a noise-suppressing unit, which is arranged between said exposure system and said air-conditioner, and which reduces noise generated by said air-conditioner, said noise-suppressing unit being spaced apart from and connected by ducts to said chamber and to an air-conditioning room in which said air-conditioner is housed.

10. An exposure apparatus according to claim 9, wherein said noise-suppressing unit includes a reactive silencer.

11. An exposure apparatus according to claim 9, wherein said noise-suppressing unit includes an active silencer.

12. An exposure apparatus according to claim 9, further comprising a temperature sensor and a temperature controller in said chamber for controlling a temperature of air in said chamber at a selected target temperature.

13. An exposure apparatus according to claim 9, further comprising a dust and dirt filter and a chemical substance filter for cleaning the air in the chamber.

14. An exposure apparatus according to claim 9, further comprising a microphone for detecting sound signals and for converting said sound signals being supplied to a signal-processing circuit.

15. An exposure apparatus according to claim 14, further comprising an amplifier for amplifying and supplying signals of opposite phase from said sound signals, said signals of opposite phase being supplied from said signal-processing circuit to a speaker for generating acoustic signals in said chamber.

16. An exposure apparatus according to claim 9, further comprising means for controlling vibrations of a moving mirror attached to a wafer stage in said chamber.

17. An exposure apparatus comprising:

an exposure system which transfers a pattern of a mask onto a substrate;

a chamber which is provided around said exposure apparatus and houses said exposure system;

an air-conditioner which is associated with said chamber and performs air-conditioning of said chamber; and a reactive means for reducing at least a portion of noise components from sound waves propagating through air from said air-conditioner at a frequency near a resonant frequency of said exposure system, the means being arranged between said exposure system and said air-conditioner.

18. An exposure apparatus comprising:

an exposure system which transfers a pattern of a mask onto a substrate;

a chamber which is provided around said exposure apparatus and houses said exposure system;

an air-conditioner which is associated with said chamber and performs air-conditioning of said chamber; and an active silencer, which is arranged between said exposure system and said air-conditioner, and reduces noise at a resonant frequency of said exposure system, said noise being a part of sound waves that are propagated through air from said air-conditioner.

19. An exposure apparatus comprising:

an exposure system which transfers a pattern of a mask onto a substrate;

a chamber which is provided around said exposure apparatus and houses said exposure system;

an air-conditioner which is associated with said chamber and performs air-conditioning of said chamber; and an active means for reducing noise at a resonant frequency of said exposure system from sound waves propagated through air from said air-conditioner, the means being arranged between said exposure system and said air-conditioner.

20. An exposure apparatus comprising:

an exposure system which transfers a pattern of a mask onto a substrate;

a chamber which is provided around said exposure apparatus and houses said exposure system;

an air-conditioner which is associated with said chamber and performs air-conditioning of said chamber; and a reactive silencer, which is arranged between said exposure system and said air-conditioner to reduce noise at a resonant frequency of said exposure system, said noise being part of sound waves propagated through air from said air-conditioner.

21. Method for exposure apparatus environment control, comprising following steps:

providing a chamber around said exposure apparatus, the apparatus having an exposure system which transfers a pattern of a mask onto a substrate;

providing an air-conditioner associated with said chamber for air-conditioning of the chamber;

detecting a characteristic resonant frequency of said exposure system; and reducing at least a portion of noise components from sound waves propagating through air from said air-conditioner at a frequency near the characteristic resonant frequency of said exposure system by arranging a reactive silencer between said air-conditioner and said exposure system on a way of the sound waves.

22. Method of exposure apparatus environment control, comprising following steps:

providing a chamber around said exposure apparatus, the apparatus having an exposure system for transfer a pattern of a mask onto a substrate;

providing an air-conditioner associated with said chamber for air-conditioning of the chamber;

detecting noise at a frequency near a mechanical resonant frequency of the exposure system, said noise being a part of sound waves propagated through air from said air-conditioner; and reducing the detected noise by generating sound signals of opposite phase to cancel the noise near the resonant frequency of said exposure system.

23. Method of exposure apparatus environment control according to claim 22, further comprising selecting a target temperature and controlling a temperature of air in said chamber.

* * * * *